United States Patent
Hata

(10) Patent No.: US 7,074,526 B2
(45) Date of Patent: Jul. 11, 2006

(54) PHOTOMASK COVERED WITH LIGHT-TRANSMISSIVE AND ELECTRICALLY-CONDUCTIVE POLYMER MATERIAL

(75) Inventor: Yoji Hata, Tateyama (JP)

(73) Assignee: UMC Japan, Chiba-Ken (JP)

( * ) Notice: Subject to any disclaimer, the term of this patent is extended or adjusted under 35 U.S.C. 154(b) by 142 days.

(21) Appl. No.: 10/456,667

(22) Filed: Jun. 5, 2003

(65) Prior Publication Data

US 2004/0018437 A1    Jan. 29, 2004

(30) Foreign Application Priority Data

Jul. 29, 2002    (JP)    ............................. 2002-220420

(51) Int. Cl.
 *G03F 9/00*    (2006.01)

(52) U.S. Cl. ........................................................ 430/5

(58) Field of Classification Search ..................... 430/5
See application file for complete search history.

(56) References Cited

U.S. PATENT DOCUMENTS

| | | | | |
|---|---|---|---|---|
| 3,949,131 | A  * | 4/1976 | Fraser | 428/201 |
| 5,597,669 | A  * | 1/1997 | Hamada et al. | 430/5 |
| 6,605,392 | B1 * | 8/2003 | Matsumoto et al. | 430/5 |
| 6,635,393 | B1 * | 10/2003 | Pierrat | 430/5 |

* cited by examiner

*Primary Examiner*—Christopher G. Young
(74) *Attorney, Agent, or Firm*—Cohen, Pontani, Lieberman & Pavane

(57) ABSTRACT

A photomask by which no electrostatic damage or damage of a mask pattern due to electrification is produced. The photomask has a substrate; mask patterns formed on the substrate, which are made of a light blocking material and are covered with a light-transmissive and electrically conductive polymer material. Even the mask patterns which are isolated from each other on the substrate are electrically conductive with each other. Typically, the mask patterns are covered with an electrically conductive film made of the light-transmissive and electrically conductive polymer material. The electrically conductive film may have a thickness by which when foreign particles land on the electrically conductive film, an optical image of the foreign particles is defocused on a sample to be exposed in the exposure process, so that shapes of the foreign particles are not transferred. In this case, a pellicle, which is conventionally provided on the substrate, is unnecessary.

9 Claims, 3 Drawing Sheets

PHOTOMASK COVERED WITH LIGHT-TRANSMISSIVE AND ELECTRICALLY-CONDUCTIVE POLYMER MATERIAL

BACKGROUND OF THE INVENTION

1. Field of the Invention

The present invention relates to photomasks used in a photolithography process in manufacturing of semiconductor devices or the like.

2. Description of the Related Art

FIGS. 3A and 3B show a typical conventional example of the photomasks, in which mask patterns 2 are formed on a quartz substrate 1, where each mask pattern is made of a light blocking (or shielding) material which is metallic and conductive. More specifically, each mask pattern 2 is made of one or more layers of chromic light blocking material such as Cr (chromium) or chromic oxide, which are stacked on each other.

In such a photomask, a pellicle 3 may be provided on one face of the photomask, on which the mask patterns 2 are formed, or on both faces of the photomask. The pellicle 3 is provided for preventing foreign particles from landing on the photomask (when the photomask is used). Such foreign particles on the photomask may produce a defective pattern in the exposure process.

The pellicle 3 consists of a pellicle frame 4 which is typically attached to a peripheral area around the mask patterns 2, and a pellicle film 5 which is adhered to the pellicle frame 4.

In this structure, even when foreign particles land on the pellicle 3, if the particle size of the foreign particles is not very large (i.e., smaller than a specific size), a considerable distance can be secured between the foreign particles and the top faces of the mask patterns 2. Therefore, in the exposure process, an optical image of the foreign particles is defocused, so that the shapes of the foreign particles are not transferred.

In the above-explained photomask, as shown in FIGS. 3A and 3B, the mask patterns 2 are independently provided on the quartz substrate 1, and thus the mask patterns 2 are also electrically isolated from each other. Therefore, electrostatic damage may occur due to electrification of the photomask itself, static electricity charged from the outside, or the like.

There are photomasks having long service life, which are used for long periods of 1 year or more. Regarding photomasks used for long periods, in particular, when the mask patterns 2 are made of metallic material or the like, the photomask is generally used for a long time and the mask patterns 2 may be damaged by radiation energy from an exposure apparatus (e.g., a stepper).

In order to solve the above problems, the following measures have been conventionally taken.
1. The operator who treats the photomask puts on a grounding band, antistatic shoes, and the like, so as to avoid being electrically charged.
2. An ionizer is employed in the place where the photomask is treated, so as to avoid the photomask being electrically charged.
3. An expensive mask inspection system is employed so as to perform acceptance inspection, sampling inspection (regularly performed), and the like, so as to confirm the quality of the photomask and to maintain required quality of the products.

Although the above-explained measures are performed as minimum requirements, problems such as electrostatic damage of the photomask and damage of the pattern cannot be solved at present.

SUMMARY OF THE INVENTION

In consideration of the above circumstances, an object of the present invention is to provide a photomask by which no electrostatic damage or damage of a mask pattern due to electrification is produced.

Therefore, the present invention provides a photomask used in an exposure process in photolithography, comprising:

a substrate;

mask patterns formed on the substrate, which are made of a light blocking material and are covered with a light-transmissive and electrically conductive polymer material.

The mask patterns may be isolated from each other on the substrate.

Typically, the mask patterns are covered with an electrically conductive film made of the light-transmissive and electrically conductive polymer material.

In this case, the photomask may further comprise a pellicle, provided on a face of the photomask on which the electrically conductive film is formed, the pellicle having a portion which is positioned above the electrically conductive film and which has a sufficient transmittance for exposure light, by which when foreign particles land on the pellicle, an optical image of the foreign particles is defocused on a sample to be exposed in the exposure process, so that shapes of the foreign particles are not transferred.

According to the photomask, the mask patterns are covered with a light-transmissive and electrically conductive polymer material; thus, even the mask patterns which are isolated from each other on the substrate are not electrically isolated and electrically conductive with each other by an electrically conductive film or the like, which is made of the light-transmissive and electrically conductive polymer material. Therefore, it is possible to prevent electrostatic damage of the mask patterns due to electrification of the photomask itself, static electricity charged from the outside, or the like.

As the electrostatic damage is prevented as explained above, the photomask has resistance for long-term use, so that it is also possible to prevent the mask patterns from being damaged due to radiation energy from an exposure apparatus, or the like.

When the mask patterns are covered with the electrically conductive film, preferably, the electrically conductive film has a thickness by which when foreign particles land on the electrically conductive film, an optical image of the foreign particles is defocused on a sample to be exposed in the exposure process, so that shapes of the foreign particles are not transferred.

Accordingly, even when foreign particles land on the electrically conductive film made of the light-transmissive and electrically conductive polymer material, an optical image of the foreign particles is defocused on a sample to be exposed in the exposure process, and shapes of the foreign particles are not transferred. Therefore, this electrically conductive film functions as a pellicle which is conventionally provided on the substrate; thus, no pellicle is necessary in this case.

The electrically conductive film may cover almost an entirety of a light irradiation area on the substrate in the exposure process, where the mask patterns are formed in the area.

Typically, the substrate is one of a quartz substrate and a glass substrate.

According to the present invention, the long-term quality of the photomask itself can be assured, thereby drastically reducing the working cost or heavy investment for quality assurance of the photomask.

BRIEF DESCRIPTION OF THE DRAWINGS

FIG. 1A is a plan view and FIG. 1B is a sectional view taken along line A—A in FIG. 1A.

FIG. 2A is a plan view and FIG. 2B is a sectional view taken along line B—B in FIG. 2A.

FIG. 3A is a plan view and FIG. 3B is a sectional view taken along line C—C in FIG. 3A.

DESCRIPTION OF THE PREFERRED EMBODIMENTS

Hereinafter, embodiments according to the present invention will be explained with reference to the drawings.

Figure 1A:
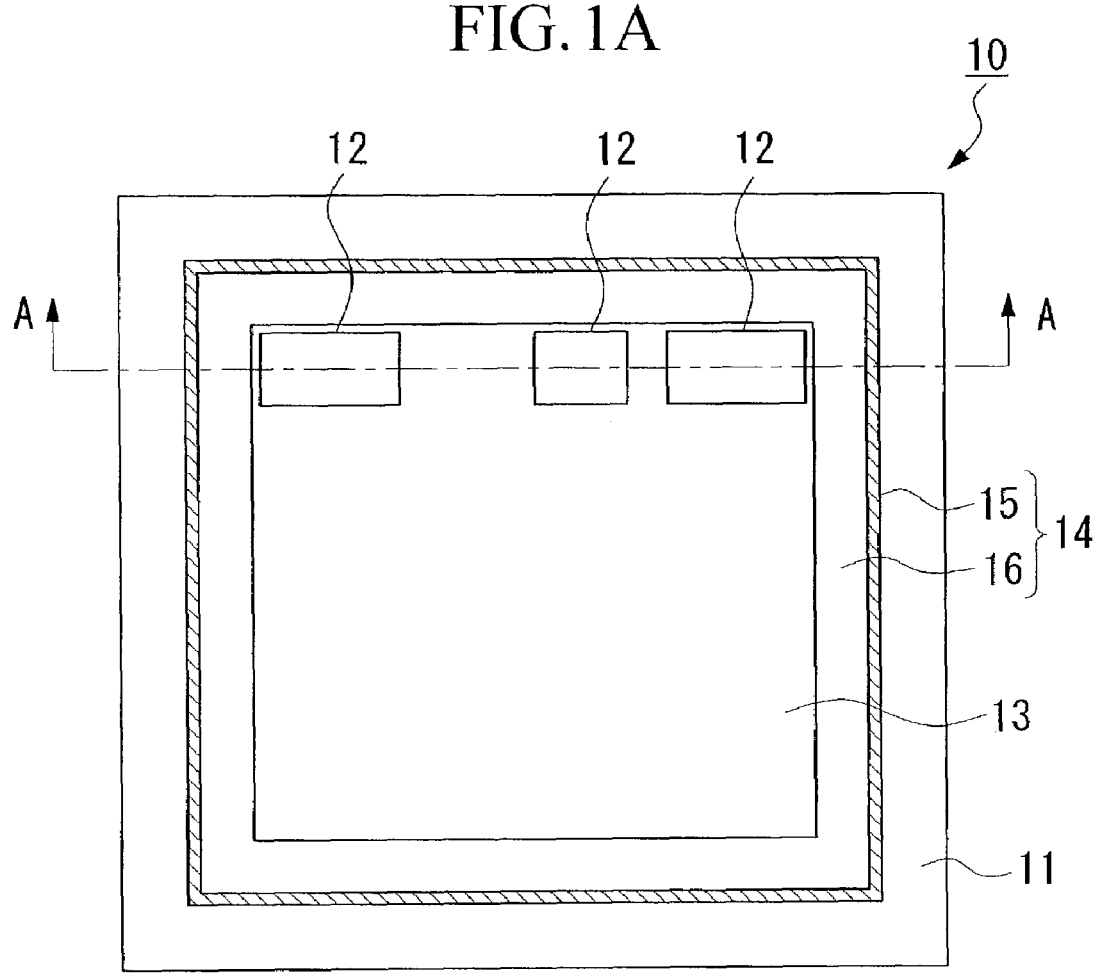
FIGS. 1A and 1B are diagrams showing the first embodiment of the photomask of the present invention, where
Figure 1B:
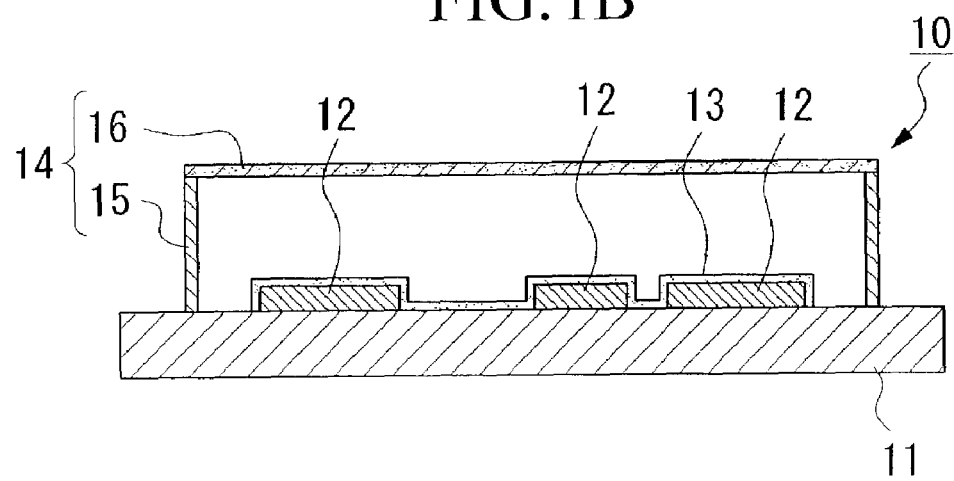

FIGS. 1A and 1B are diagrams showing the first embodiment of the photomask of the present invention.

In the figures, reference numeral 10 indicates a photomask. On this photomask 10, mask patterns 12, made of metallic and light blocking (or shielding) material, are provided on a quartz substrate 11. More specifically, each mask pattern 12 is made of one or more layers of a chromic light blocking material such as Cr (chromium) or chromic oxide, which are stacked on each other. In this embodiment, each mask pattern 12 is isolated from the others.

On the quartz substrate 11, an electrically conductive film 13, made of a light-transmissive and electrically-conductive polymer, is provided. The light-transmissive and electrically-conductive polymer may be a transparent resin such as polypropylene, polystyrene, ABS resin, or the like, to which an electrically conductive material is added (so as to impart the ability to conduct electricity), which may be metal powder, metal fibers, metal-coated fibers, carbon-coated fibers, metal flakes, or the like. In addition, a polymer, which itself is conductive, can of course be employed. For example, a polymer having conjugated double bonds may be used.

The electrically conductive film 13 covers not only all the mask patterns 12 but also almost the entire effective area, which receives light in the exposure process, on the quartz substrate 11. Accordingly, the mask patterns 12 are electrically conductive with each other, and the electrically conductive area on the quartz substrate 11 also includes portions where no mask pattern 12 is provided. The thickness of the electrically conductive film 13 is not specifically limited in the present embodiment, and a thickness for producing preferable conductivity through the continuously-arranged conductive film can be employed.

Also in such a photomask 10, a pellicle 14 is provided on one face of the photomask, on which the mask patterns 12 are formed; that is, the electrically conductive film 13 is formed. The pellicle 14 consists of a pellicle frame 15 which is attached to a peripheral area around the electrically conductive film 13, and a pellicle film 16 which is adhered to the pellicle frame 15. The pellicle frame 15 is made of a material which sheds fewer foreign particles. The pellicle film 16 is made of a material which has a high transmittance of the exposure light (i.e., light used for exposure) and has a sufficient resistance with respect to irradiation of the exposure light.

The above-explained photomask 10 may be used in the exposure process for a silicon wafer or the like, so as to perform patterning of various elements, thereby manufacturing a semiconductor device or the like.

In addition, all mask patterns 12 are covered with the electrically conductive film 13 which is continuously arranged (i.e., with a single film). Therefore, all mask patterns 12 are electrically conductive and no mask pattern 12 is electrically isolated, regardless whether the photomask 10 is actually used or is stored (for the next use). Accordingly, it is possible to prevent electrostatic damage of the mask patterns 12 due to electrification of the photomask 10 itself, static electricity charged from the outside, or the like.

As the electrostatic damage is prevented as explained above, the photomask 10 has resistance for long-term use, so that it is also possible to prevent the mask patterns 12 from being damaged due to radiation energy from an exposure apparatus, or the like.

Additionally, the electrically conductive film 13, made of a light-transmissive and electrically-conductive polymer, is a transparent (or translucent) material; thus, this electrically conductive film 13 is not transferred onto a silicon wafer and only originally designed patterns which include the mask patterns 12 in FIGS. 1A and 1B are correctly transferred onto the silicon wafer.

In addition, the pellicle 14 is provided; thus, even if foreign particles, which are not very large, are present on the pellicle 14, a considerable distance can be secured between the foreign particles and the top faces of the mask patterns 2. Therefore, in the exposure process, an optical image of the foreign particles is defocused on a sample to be exposed, so that the shapes of the foreign particles are not transferred.

Therefore, according to the photomask 10, the electrostatic damage of the mask patterns 12 can be prevented, and it is also possible to prevent the mask patterns 12 from being damaged due to a long-term usage. Therefore, the long-term quality of the photomask 10 itself can be assured, thereby drastically reducing the working cost or heavy investment for quality assurance of the photomask 10.

Figure 2A:
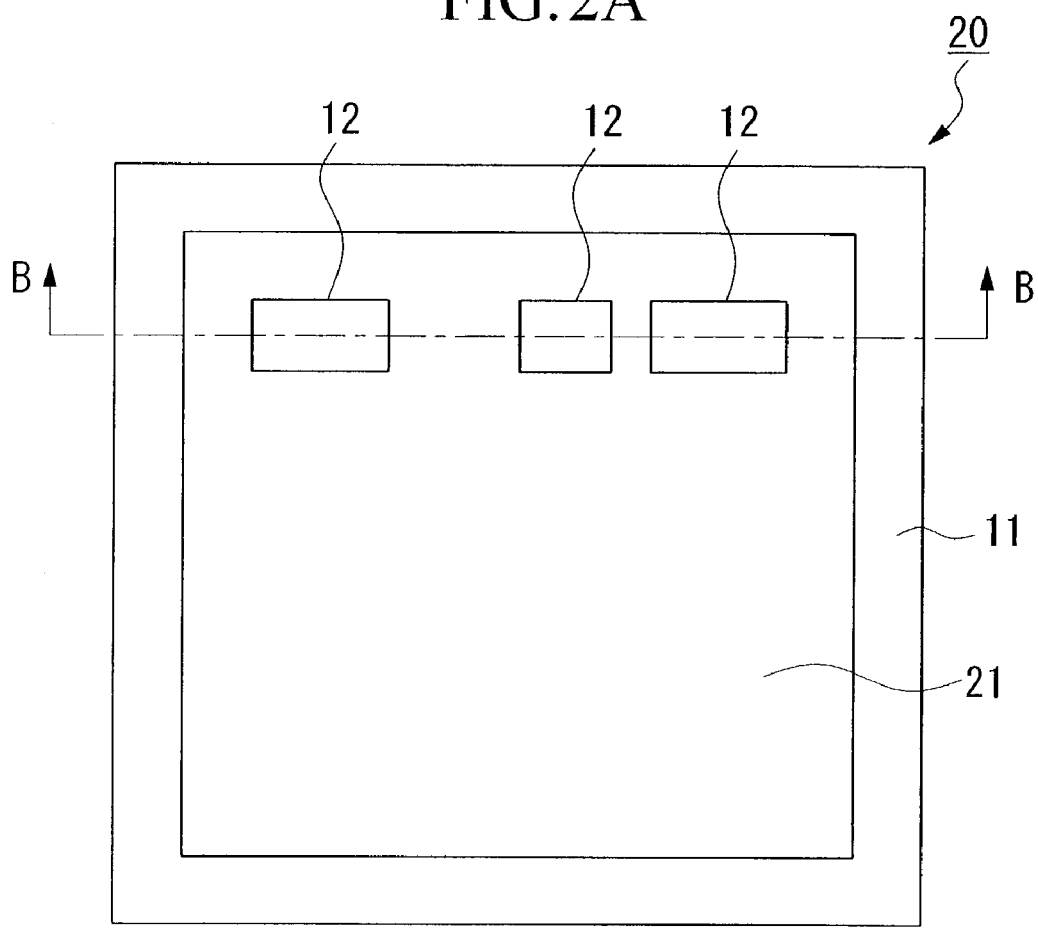
FIGS. 2A and 2B are diagrams showing the second embodiment of the photomask of the present invention, where
Figure 2B:
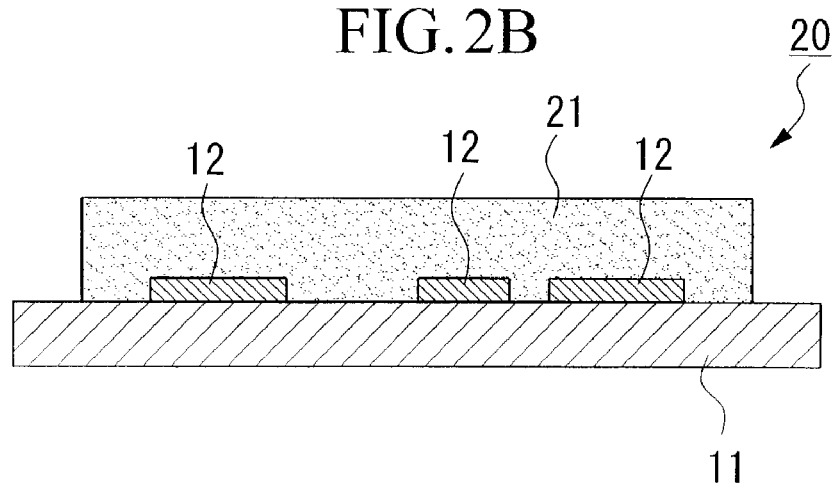
Figure 3A:
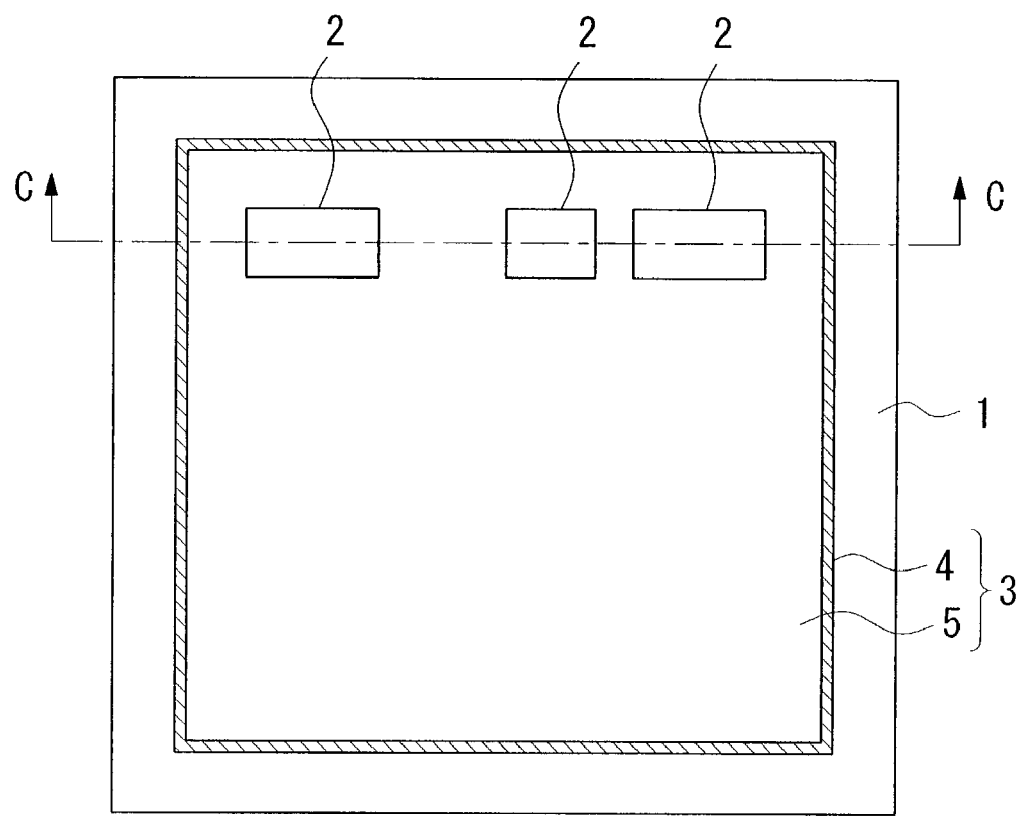
FIGS. 3A and 3B are diagrams showing a conventional example of the photomask, where
Figure 3B:
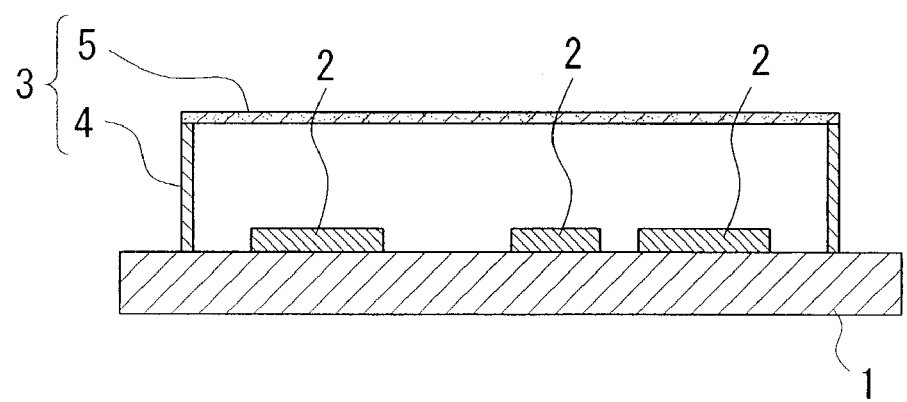

FIGS. 2A and 2B are diagrams showing the second embodiment of the present invention. In the figures, reference numeral 20 indicates a photomask. The distinctive feature of this photomask 20, in comparison with the photomask 10 shown in FIGS. 1A and 1B, is that no pellicle 14 is provided and instead the thickness of the electrically conductive film is greater.

That is, in the photomask 20 shown in FIGS. 2A and 2B, the electrically conductive film 21, made of a light-transmissive and electrically conductive material, covers the mask patterns 12 and the other light irradiation area on the quartz substrate 11, and additionally, the electrically conductive film 21 has a thickness equal to or greater than a predetermined value. This "thickness equal to or greater than a predetermined value" is such a thickness for satisfying the following condition. That is, when foreign particles are present on the electrically conductive film 21, the optical image of the foreign particles is defocused on a sample to be exposed and thus the shapes of the foreign particles are not transferred. As a typical example, the thickness is 6 mm or greater.

The electrically conductive film 21 having the above-explained thickness has a similar function of that of the pellicle 14 shown in FIGS. 1A and 1B, that is, a function for solving the problem caused by foreign particles, so that no pellicle 14 is necessary. Therefore, the cost for the pellicle 14 itself or the cost for producing the pellicle 14 are also unnecessary, thereby reducing the total cost.

The electrically conductive film 21 has an above-explained thickness; thus, the electrically conductive film 21 itself has a sufficient electrical conductivity through the film. Accordingly, electrostatic damage due to electrification, static electricity charged from the outside, or the like, can be more reliably prevented.

The present invention is not limited to the above-explained embodiment, and any modification or variation within the scope and spirit of the claimed invention is possible. For example, the area where the electrically conductive film is formed may be limited to a minimum area and shape for making all mask patterns 12 electrically conductive with each other.

In addition, in the above embodiment, a quartz substrate is used as a substrate; however, a glass substrate or the like may be employed.

What is claimed is:

1. A photomask for a photolithography exposure process, comprising:
   a substrate;
   mask patterns formed on the substrate, said mask patterns being comprised of a light blocking material; and
   a light-transmissive and electrically conductive polymer material covering the mask patterns and portions of the substrate between the mask patterns in a manner such that the mask patterns are electrically conductive with each other and with portions of the substrate between the mask patterns;
   wherein the light-transmissive and electrically-conductive polymer is one of a transparent resin to which an electrically conductive material is added and a polymer having conjugated double bonds.

2. The photomask as claimed in claim 1, wherein the mask patterns are covered with an electrically conductive film made of the light-transmissive and electrically conductive polymer material.

3. The photomask as claimed in claim 2, wherein the electrically conductive film has a thickness by which, when foreign particles land on the electrically conductive film, an optical image of the foreign particles is defocused on a sample which is exposed during an exposure process, so that shapes of the foreign particles are not transferred to the sample.

4. The photomask as claimed in claim 1, wheiein the mask patterns are isolated from each other on the substrate.

5. The photomask as claimed in claim 2, wherein the electrically conductive film covers almost an entirety of a light irradiation area on the substrate in the exposure process, where the mask patterns are formed in the area.

6. The photomask as claimed in claim 2, further comprising:
   a pellicle, provided on a face of the photomask on which the electrically conductive film is formed, the pellicle having a portion which is positioned above the electrically conductive film and which has a sufficient transmittance for exposure light, by which when foreign particles land on the pellicle, an optical image of the foreign particles is defocused on a sample to be exposed in the exposure process, so that shapes of the foreign particles are not transferred to the sample.

7. The photomask as claimed in claim 1, wherein the substrate is one of a quartz substrate and a glass substrate.

8. The photomask as claimed in claim 1, wherein the transparent resin is one of polypropylene, polystyrene and ABS resin.

9. The photomask as claimed in claim 1, wherein the electrically conductive material is one of metal powder, metal fibers, metal-coated fibers, carbon-coated fibers and metal flakes.

* * * * *